United States Patent
Kurokawa

(10) Patent No.: US 12,241,956 B2
(45) Date of Patent: Mar. 4, 2025

(54) MAGNETIC RESONANCE IMAGING APPARATUS, IMAGE PROCESSOR, AND IMAGE PROCESSING METHOD

(71) Applicant: FUJIFILM Healthcare Corporation, Kashiwa (JP)

(72) Inventor: Shinji Kurokawa, Tokyo (JP)

(73) Assignee: FUJIFILM Corporation, Tokyo (JP)

( * ) Notice: Subject to any disclaimer, the term of this patent is extended or adjusted under 35 U.S.C. 154(b) by 355 days.

(21) Appl. No.: 17/501,099

(22) Filed: Oct. 14, 2021

(65) Prior Publication Data
US 2022/0128639 A1     Apr. 28, 2022

(30) Foreign Application Priority Data

Oct. 22, 2020  (JP) ................. 2020-177601

(51) Int. Cl.
| G01R 33/565 | (2006.01) |
| G01R 33/56  | (2006.01) |
| G06T 7/11   | (2017.01) |
| G06T 11/00  | (2006.01) |

(52) U.S. Cl.
CPC ....... G01R 33/565 (2013.01); G01R 33/5608 (2013.01); G06T 7/11 (2017.01); G06T 11/008 (2013.01); *G06T 2207/10088* (2013.01); *G06T 2207/20021* (2013.01)

(58) Field of Classification Search
CPC .......... G01R 33/5608; G01R 33/561; G01R 33/565; G01R 33/56545; G06T 11/008; G06T 2207/10088; G06T 2207/20021; G06T 7/11
See application file for complete search history.

(56) References Cited

U.S. PATENT DOCUMENTS

| 8,089,278 B1* | 1/2012 | Du ..................... G01R 33/5635 324/307 |
| 2004/0151358 A1* | 8/2004 | Yanagita ............... G06T 7/0012 382/132 |
| 2008/0054899 A1* | 3/2008 | Aksoy ................ G01R 33/5611 324/307 |
| 2010/0034447 A1* | 2/2010 | Geier ................... G01R 33/482 382/131 |
| 2015/0077112 A1* | 3/2015 | Otazo .................. A61B 5/7207 324/318 |

(Continued)

OTHER PUBLICATIONS

M. Lustig et al., "Sparse MRI: The Application of Compressed Sensing for Rapid MR Imaging", Magnetic Resonance in Medicine 58: 1182-1195 (2007).

(Continued)

*Primary Examiner* — Manuchehr Rahmjoo
(74) *Attorney, Agent, or Firm* — Paul Teng

(57) ABSTRACT

A problem of time elongation in image reconstruction due to necessity of many iterations is solved, when an image is reconstructed by performing iterative approximation on measurement data acquired by an MRI apparatus without full-sampling. Density is estimated in the course of the iteration, and density is corrected using thus estimated density. Density estimation is performed not only on initial values but also on every iteration process, thereby enabling convergence with a smaller number of iterations.

9 Claims, 16 Drawing Sheets

(56) References Cited

U.S. PATENT DOCUMENTS

2015/0126850 A1* 5/2015 Cetingul ............... G01R 33/20
                                                    324/309
2020/0278410 A1* 9/2020 Millard ............... G01R 33/561

OTHER PUBLICATIONS

G. Plonka et al., "Curvelet-Wavelet Regularized Split Bregman Iteration for Compressed. Sensing", Int'l J of Wavelets, Multiresolution and Information Processing, vol. 09, No. 01, pp. 79-110 (2011).
James G. Pipe, et al.,, "Sampling Density Compensation in MRI: Rationale and an Iterative Numerical Solution", Magnetic Resonance in Medicine, vol. 41, pp. 179-186 (1999).
Japanese official action dated Jun. 18, 2024 (and English translation thereof) in connection with Japanese Patent Application No. 2020-177601.

* cited by examiner

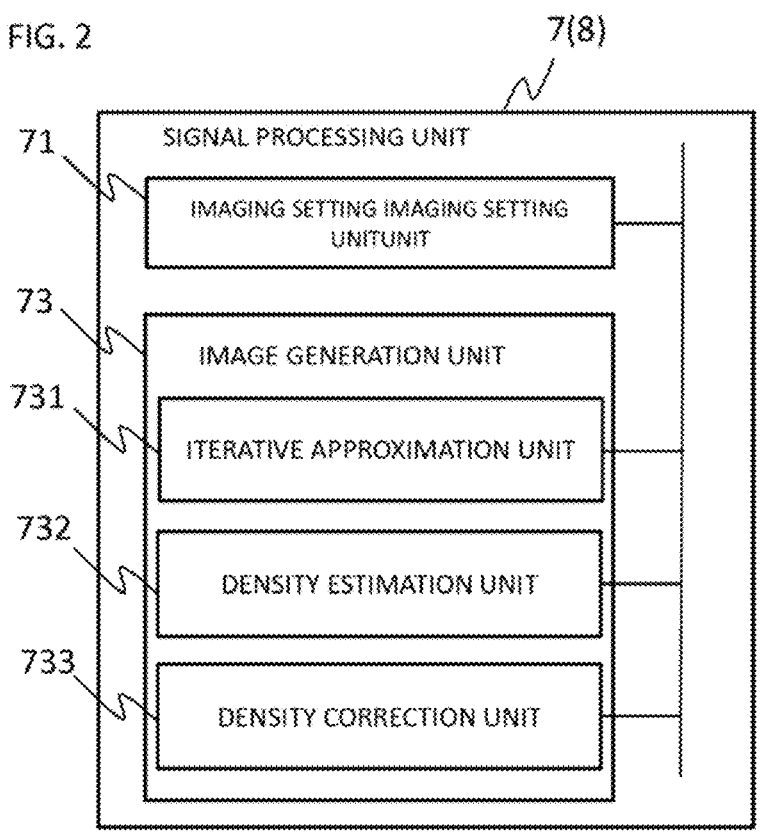

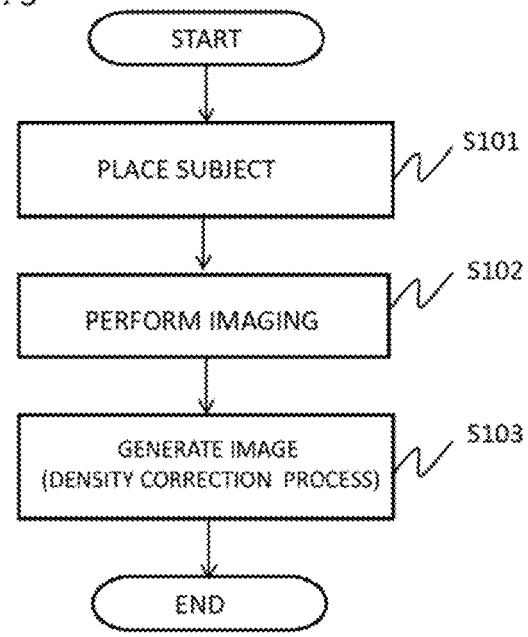

MAGNETIC RESONANCE IMAGING APPARATUS, IMAGE PROCESSOR, AND IMAGE PROCESSING METHOD

CROSS-REFERENCE TO RELATED APPLICATION(S)

The present application claims priority from Japanese patent application JP-2020-177601 filed on Oct. 22, 2020, the contents of which are hereby incorporated by reference into this application.

BACKGROUND OF THE INVENTION

Field of the Invention

The present invention relates to a magnetic resonance imaging apparatus (hereinafter, referred to as MRI apparatus), in particular, to a technique for reconstructing an image by iterative approximation using insufficient data.

Description of the Related Art

There is a technique of reconstructing an image by iterative approximation when data is insufficient, and this technique is utilized in compressed sensing (CS) for MRI ("Sparse MRI: The Application of Compressed Sensing for Rapid MR Imaging", Michael Lustig, David Donoho, and John M. Pauly, Magnetic Resonance in Medicine 58: 1182-1195 (2007), which will be referred to as Non-Patent Document 1, and U.S. Patent Publication No. 2015/0126850, which will be referred to as Patent Document 1). When data to be acquired at the time of imaging is reduced, the imaging time can be shortened. In this case, however, many iterative processes including the wavelet transform and the curvelet transform along with their inverse transforms are required for reconstructing an image, causing a problem that the reconstruction time becomes long.

There are several techniques for speedup the iterative process. For example, there is an excellent method called as Alternating Split Bregman method, which is a high-speed process even using a plurality of transforms such as the wavelet transform and the curvelet transform in the iterative process ("Curvelet-Wavelet Regularized Split Bregman Iteration for Compressed Sensing", Gerlind Plonka, Jianwei Ma., International Journal of Wavelets, Multiresolution and Information Processing, Vol. 09, No. 01, pp. 79-110 (2011), which will be referred to as Non-Patent Document 2).

There is also a method to accelerate convergence by performing density correction in initial values of the iteration. The density correction is a process of weighting data according to a density distribution of measurement data.

SUMMARY OF THE INVENTION

Technical Problem

Although the Alternating Split Bregman method described in Non-Patent Document 2 and the density correction performed in advance may considerably improve the efficiency of the iterative process, still many iterations are required, and there still remains the problem that the reconstruction time is long. Therefore, further reduction of the reconstruction time is desired.

Solution to Problem

In order to solve the problem above, the present invention performs the density correction on data as an interim result in the course of the iteration. The density correction is performed based on the density of the data targeted for the correction. However, the density of the data in the course of the iterative operation varies because there is created interim data which is not finally acquired. In the present invention, the density correction of the interim result is performed in accordance with the varying density.

An MRI apparatus (30) of the present invention is provided with an imaging unit (31) configured to acquire measurement data comprising a nuclear magnetic resonance signal, and an image generation unit (300) configured to generate an image according to iterative approximation using the measurement data acquired by the imaging unit with undersampling, wherein the image generation unit comprises a iterative approximation unit (310) configured to update the measurement data by performing the iterative approximation on the measurement data, and a density correction unit (330) configured to perform density correction on the measurement data (FIG. 1A). In repeating the iterative approximation, the density correction unit performs the density correction with varying a density correction amount for each iteration.

An image processor of the present invention comprises the aforementioned functions of the image generation unit.

An image processing method (FIG. 1B) for generating an image by performing the iterative approximation on the measurement data, comprises a transforming process for transforming the measurement data into processed spatial data of the iterative approximation (S51), an updating process for transforming the processed spatial data subjected to the iterative approximation into the measurement data to obtain updated measurement data (S53), and a density correction process for performing density correction on the updated measurement data, every time the transforming process (S55) and the updating process are repeated using the updated measurement data, wherein the density correction is performed with varying a density correction amount for each iteration (S57, no).

According to the present invention, there are performed, not only the density correction using the initial values of the density of the measurement data, but also the density correction in accordance with the density of data targeted in every iterative process, thereby enabling convergence of the iterative approximation with a smaller number of iterations.

Further, the present invention finally performs a density estimation for the density correction, thereby achieving a reconstructed image closer to a correct solution. This allows reduction of the number of iterations for speedup.

BRIEF DESCRIPTION OF THE DRAWINGS

FIG. 2 is a functional block diagram of a signal processing unit of the MRI apparatus according to a first embodiment;

FIG. 3 is a flow diagram showing an outline of the processing of the MRI apparatus according to an embodiment;

DETAILED DESCRIPTION OF THE PREFERRED EMBODIMENTS

Figure 1:
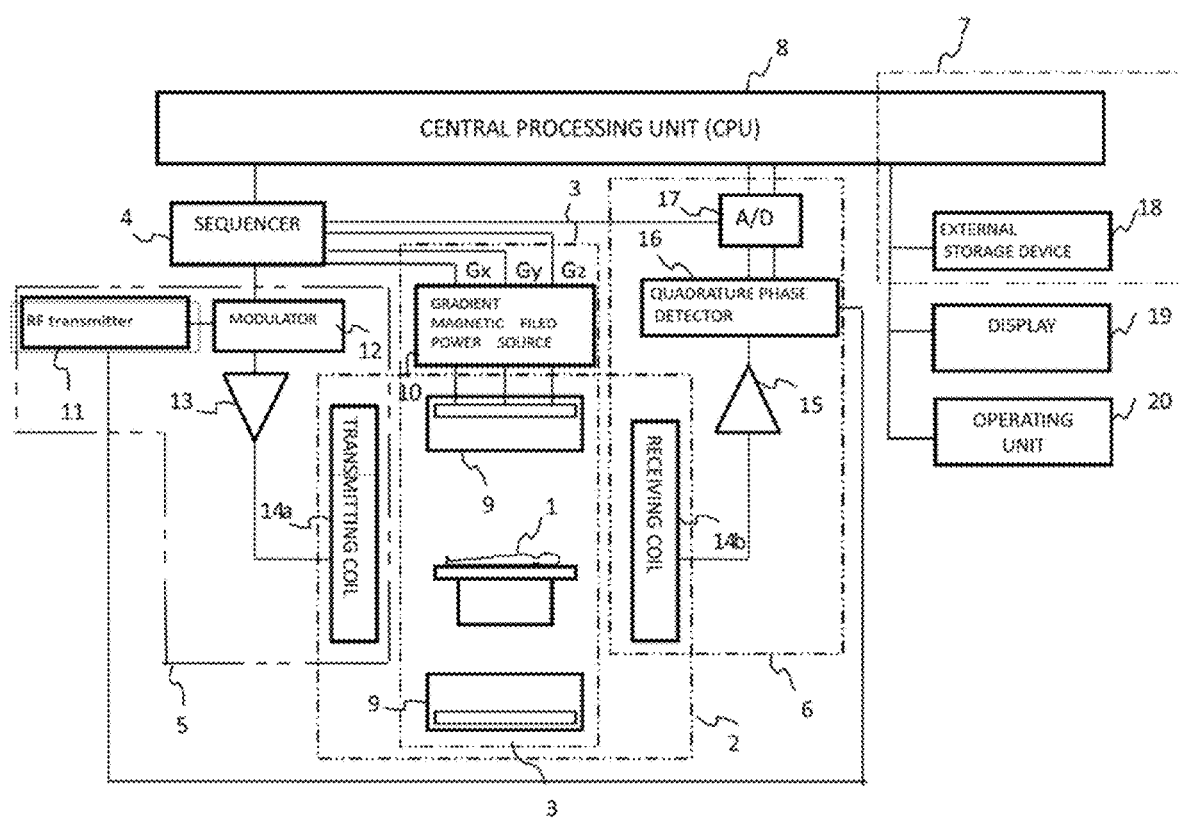
FIG. 1 illustrates an overall configuration of an example of an MRI apparatus to which the present invention is applied.
Figure 1A:
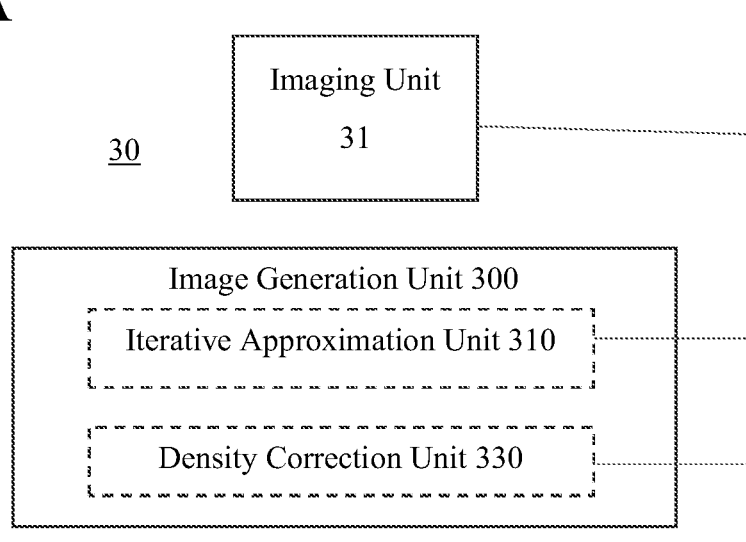
FIG. 1A is a functional block diagram in connection with an MRI apparatus.
Figure 1B:
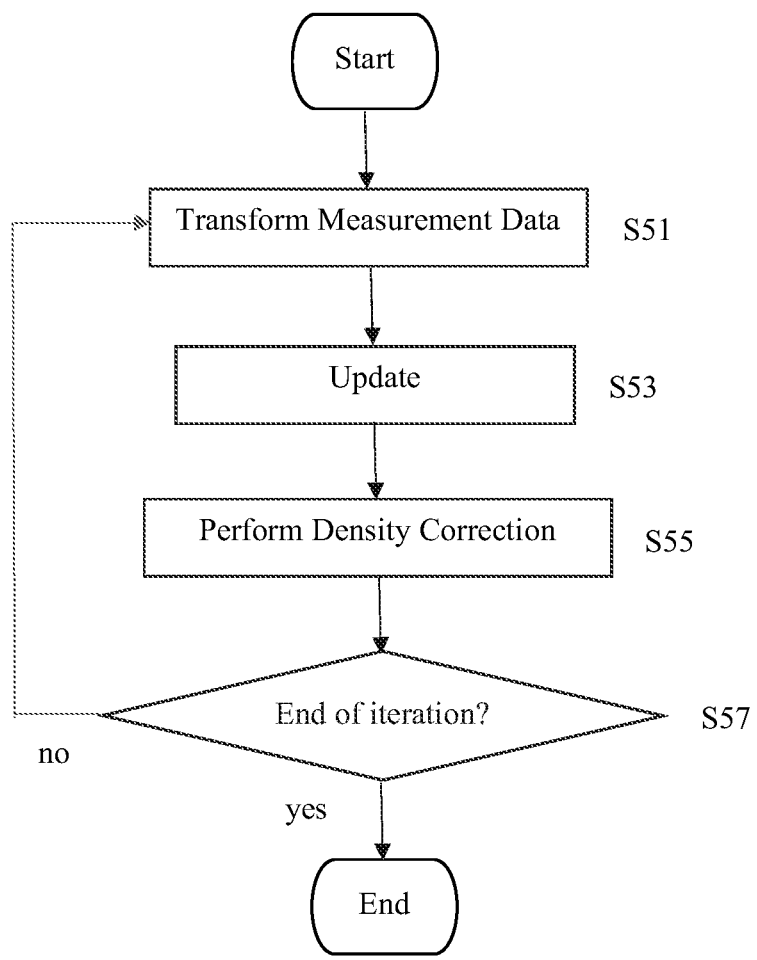
FIG. 1B is a flow diagram showing an image processing method.

First, an overview an MRI apparatus to which the present invention is applied will be described with reference to the accompanying drawings. FIG. 1 is a block diagram illustrating an overall configuration of an embodiment of the MRI apparatus according to the present invention. The MRI apparatus is intended to obtain a tomographic image of a subject by utilizing NMR phenomena, and it is provided with a static magnetic field generator 2, a gradient magnetic field generator 3, a transmission unit 5, a receiving unit 6, a signal processing unit 7, a sequencer 4, and a central processing unit (CPU) 8. In the following description, the static magnetic field generator 2, the gradient magnetic field generator 3, the sequencer 4, the transmission unit 5, and the receiving unit 6 are collectively referred to as an imaging unit.

The static magnetic field generator 2 is configured to generate a uniform static magnetic field in the space around the subject 1, the static magnetic field generator comprising a static magnetic field generation unit of a permanent magnet type, a normal conducting type, or a superconducting type. Depending on the direction of the magnetic field being generated, there are a vertical magnetic field system, a horizontal magnetic field system, and others, and the present invention can be applied to any of the systems.

The gradient magnetic field generator 3 comprises gradient magnetic field coils 9 for applying gradient magnetic fields in three axial directions of X, Y, and Z, being a coordinate system (stationary coordinate system) of the MRI apparatus, and a gradient magnetic field power source 10 for driving the gradient magnetic field coil, and gradient magnetic fields Gx, Gy, Gz are applied respectively in the three axial directions of X, Y, and Z by driving the gradient magnetic field power sources 10 of the respective coils according to an instruction from the sequencer 4. A combination of these three axial gradient magnetic fields allows generation of a gradient magnetic field in any direction. For example, at the time of imaging, a slice plane is set on the subject 1 by applying a slice direction gradient magnetic field pulse (Gs) in a direction perpendicular to the slice plane (imaging section), and a phase encoding direction gradient magnetic field pulse (Gp) and a frequency encoding direction gradient magnetic field pulse (Gf) are applied in the remaining two directions perpendicular to the slice plane and perpendicular to each other, to encode the position information of each direction in an echo signal.

The sequencer 4 is a control unit that repeatedly applies high-frequency magnetic field pulses (hereinafter, referred to as "RF pulse") and gradient magnetic field pulses in a predetermined pulse sequence, operates under the control of the CPU 8, and sends various instructions required for acquiring tomographic image data of the subject 1, to the transmission unit 5, the gradient magnetic field generator 3, and the receiving unit 6.

The transmission unit 5 is configured to irradiate the subject 1 with the RF pulse, in order to cause nuclear magnetic resonance of nuclear spins of atoms constituting biological tissue of the subject 1, and the transmission unit 5 is provided with an RF transmitter 11, a modulator 12, an RF amplifier 13, and a transmission-side RF coil (transmitting coil) 14a. The RF pulse outputted from the RF transmitter 11 is amplitude-modulated by the modulator 12 at a timing according to a command from the sequencer 4, then the RF amplifier 13 amplifies the amplitude-modulated RF pulse, to be supplied to the transmitting coil 14a disposed close to the subject 1, whereby the subject 1 is irradiated with the RF pulse.

The receiving unit 6 detects an echo signal (NMR signal) emitted by nuclear magnetic resonance of the nuclear spins constituting the biological tissue of the subject 1, and includes an RF coil (receiving coil) 14b on the receiving side, a signal amplifier 15, a quadrature phase detector 16, and an A/D converter 17. The NMR signal as a response from the subject 1, induced by an electromagnetic wave applied from the transmitting coil 14a, is detected by the receiving coil 14b disposed close to the subject 1, and then amplified by the signal amplifier 15. Afterwards, the quadrature phase detector 16 divides the NMR signal into two orthogonal systems at a timing according to a command from the sequencer 4, and the A/D converter 17 converts each signal into a digital amount, and then transmitted to the signal processing unit 7.

The signal processing unit 7 performs various data processing, displaying, and storing a processing result, and so on, and a part of the functions is implemented by the CPU 8. The processing performed by the signal processing unit 7 (CPU 8) includes image reconstruction of the subject 1, calculation of numerical values indicating characteristics of the subject, and correction of the signals and the processing result, using characteristics of the apparatus, such as a receiving coil sensitivity.

The signal processing unit 7 is provided with an external storage device 18 such as an optical disk and a magnetic disk, a display 19, and an operating unit 20 including a trackball or a mouse, a keyboard, and the like. When data from the receiving unit 6 is inputted into the CPU 8, the CPU 8 executes processing such as signal processing and image reconstruction, and displays a resulting tomographic image of the subject 1 on the display 19, together with recording the result on the magnetic disk, or the like, in the external storage device 18. The CPU 8 functions as a calculation unit for performing the processing as described above, and also functions as a control unit for controlling the sequencer 4 and the entire apparatus.

The operating unit 20 is configured to input various control information of the MRI apparatus and control information of the processing performed by the signal processing unit 7, and it is disposed close to the display 19 for an operator to interactively control the various processes of the MRI apparatus through the operating unit 20 while viewing the display 19.

In FIG. 1, the RF coil 14a on the transmission side and the gradient magnetic field coil 9 are installed in the static magnetic field space of the static magnetic field generating unit 2, in a manner facing to the subject 1 if the vertical magnetic field system is employed, or surrounding the subject 1 for the case of the horizontal magnetic field system. Further, the RF coil 14b on the receiving side is installed in a manner facing to the subject 1 or surrounding the subject 1.

Each of the transmitting coil 14a and the receiving coil 14b may be a separate RF coil, but in some cases, one RF coil also serves as both the transmitting coil 14a and the receiving coil 14b. It may also be possible to employ a whole-body coil that performs both transmitting and receiving, in combination with a separate RF coil such as a local coil.

The MRI apparatus of the present embodiment includes a function of performing iterative approximation such as CS, as a function of the signal processing unit 7 described above, in particular as a function of image generation. FIG. 2 schematically illustrates the functions of the signal processing unit 7 related to the image generation.

As shown in FIG. 2, the signal processing unit 7 includes broadly, an imaging setting unit 71 for setting imaging conditions to create a pulse sequence, and an image generation unit 73. The image generation unit 73 includes a iterative approximation unit 731 (simply referred to as an "operation part" in some cases), a density estimation unit 732, and a density correction unit 733.

The imaging setting unit 71 calculates the pulse sequence according to the imaging method and imaging conditions set by the user via the operating unit 20, or the like, and then sets the pulse sequence in the sequencer 4. The pulse sequence includes an imaging method of scanning along the axis of the Cartesian coordinate system, and also a scanning in a non-Cartesian coordinate system, such as a radial scan. Such method of scanning and an R-factor (reduction factor) set as the imaging conditions may determine how the measurement space is decimated, the density of data points to be measured, and others.

The iterative approximation unit 731 repeats operations on the measurement data, the operations including the inverse Fourier transform and the wavelet transform, and the like, as the conversion to the space for performing regularization, minimization in the space to perform the regularization, and the Fourier transform and the inverse transform of the conversion to the space to perform the regularization, along with updating the measurement data, thereby generating an image.

The density estimation unit 732 estimates a density of the data being updated in the course of the iterative operation. This estimation of the density may include a method of performing estimation from data differences, and a method that is based on a predetermined density variation curve. Details of the estimation method will be described in the embodiments described later. The density correction unit 733 uses the density estimated by the density estimation unit 732, and performs density correction on the data in the course of the iterative process.

The functions of the signal processing unit 7 described above may be implemented by executing software such as programs in a memory (storage unit) provided in the CPU 8 or incorporated in the CPU 8. Some of the functions may also be implemented in hardware such as an ASIC and FPGA.

Next, with reference to the flowchart of FIG. 3, an outline of the aforementioned imaging and signal processing performed by the MRI apparatus will be described.

First, placing the subject 1 in the static magnetic field space of the MRI apparatus (S101), imaging is performed (S102). The imaging unit performs the imaging according to the pulse sequence calculated by the imaging setting unit 71, where the imaging unit applies RF pulses and gradient magnetic field pulses to the subject and collects NMR signals generated from the subject. The NMR signals become measurement data arranged in the matrix of k-space (also referred to as k-spatial data). In the present embodiment, rather than collecting data filling all the k-space, undersampled data is obtained as the measurement data. The density of the measurement data being obtained is determined by imaging parameters such as an encoding step by the gradient magnetic field pulses, and imaging conditions such as a decimation rate (or R-factor).

Then, the image generation unit 73 uses the measurement data (NMR signals) obtained by imaging, along with updating the unmeasured data by the iterative operation of the iterative approximation unit 731, to finally generate an image of interest (S103). The intended image may include a proton density image, a weighted image such as a diffusion weighted image, and an image of calculated values derived from those images, and so on. In this image generation step S103, the density correction unit 733 performs density correction of data (hereinafter, referred to as density correction process) in the course of processing, in accordance with the data density that varies in the course of the iterative operation. The density estimated by the density estimation unit 732 may be used as the varying density of data. The density estimation method may include a method of estimation from the data differences, and a method that is based on the density variation curve determined beforehand.

There will now be described specific embodiments of the image generation method according to the present invention. The configuration of the apparatus as shown in FIGS. 1 and 2, and the outline of the operation as shown in FIG. 3 are common to each of the embodiments, and thus these figures will be referred to as appropriate.

First Embodiment

In the present embodiment, the measurement data including decimated (unacquired) measurement points is subjected to reconstruction along with updating the unacquired data by the iterative operation. In this situation, the density estimation unit 732 estimates the density in every iteration, according to the progress of updating of the unacquired data. The density correction unit 733 performs density correction based on thus estimated density.

Figure 4:
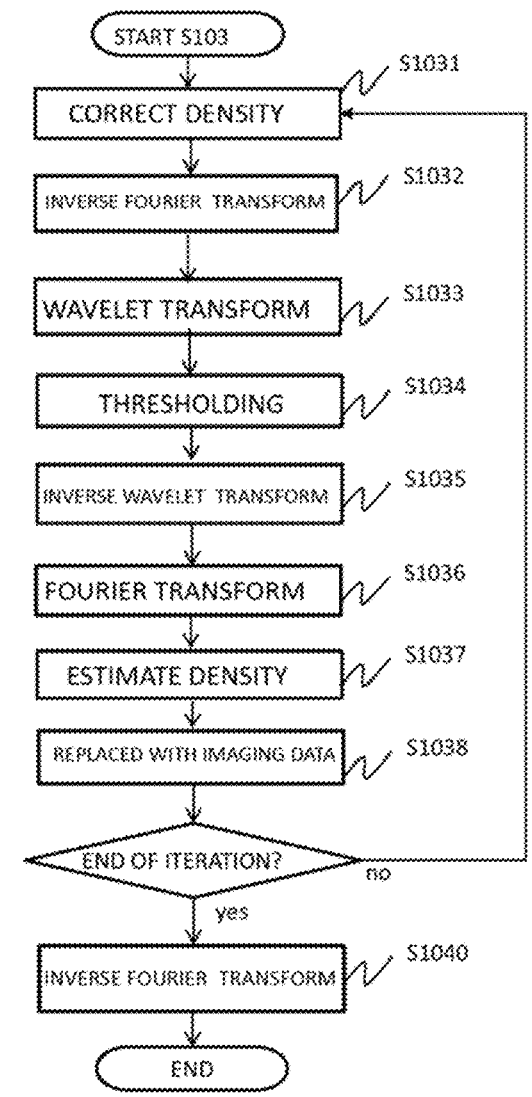
FIG. 4 is a flowchart illustrating an exemplary procedure for iterative reconstruction according to the first embodiment.

FIG. 4 shows an exemplary iterative process in the image generation process (S103) of the present embodiment. Data s0(k) acquired in the imaging (S102) is density-corrected (S1031), and transformed into an image by the inverse Fourier transform (S1032). The image is wavelet transformed (S1033), and only a large factor is retrieved by thresholding (S1034), then returned to the image by the inverse wavelet transform (S1035), and returned to k-space (space of the acquired data) by the Fourier transform (S1036). The density estimation (S1037) is performed based on this updated data. Among the updated data, the data acquired by imaging is replaced with s0(k) (S1038), and it is set as finally updated data s(k). If the updated data is not convergent, the process is repeated from the density correction (S1031) on s(k) with the estimated density. If the updated data is convergent, the iteration is terminated, and an image is generated by the inverse Fourier transform (S1040) and the process ends.

Here, the density correction (S1031) at the first time of the iteration is performed based on the density of data s0(k) (initial value). For the second and subsequent times, it is based on the density of the updated data s(k), i.e. the density estimated by S1037. The density correction is the process of weighting the data according to a density distribution of the data; the higher is the density, the smaller is the weight, and the lower is the density, the larger is the weight. The inverse of the density is called as a density correction amount.

The processing in each of the steps other than the step S1037 is the same as the processing of the iterative approximation such as publicly-known compressed sensing, and a detailed description thereof will not be given here. Further, in FIG. 4, the wavelet transform is shown as an example of the conversion to the space to perform regularization, but it is also possible to use a basis function other than the wavelet transform, the curvelet transform, and so on, or a plurality of basic functions may be combined.

Figure 5A:
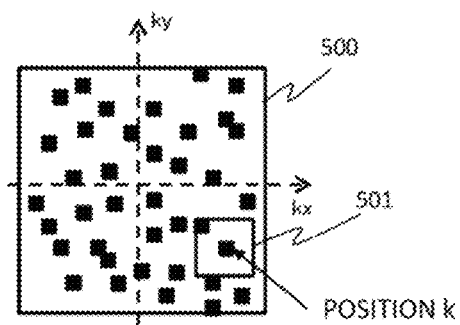
FIGS. 5A to 5D illustrate examples of density estimation methods according to the first embodiment.

With reference to FIGS. 5A to 5D, the density estimation (S1037) in the iterative process will be specifically described in the following. FIG. 5A illustrates the presence of measurement data in the k-space 500, showing the positions of the acquired data in black. Initially, the data is determined by a sampling pattern at the time of imaging. Density ρ0(k) of the sampling pattern may be determined directly from the density of data around the position k. Alternatively, if the probability of acquiring data at each position k is given as ρ0(k) as indicated by the contour lines 502 in FIG. 5B, the probability p may be assumed as the density ρ.

As for the data in the course of updating, the density is estimated according to the progress of updating. For this reason, first, insufficiency of data updating α(k) is defined as the following:

$$\alpha(k) = (b(k) - c(k))/b(k) \quad [\text{Eq. 1}]$$

where b(k) represents an average obtained by dividing the sum of the absolute values of data signal values s0(k) acquired by imaging (black areas in FIG. 5A, referred to as data acquired area), by the number of data points, and c(k) is an average obtained by dividing the sum of the absolute values in the area where the data is not acquired (white areas, referred to as data unacquired area), by the number of points of the data unacquired area, for the signal value s(k) of the updated data. The value of α(k) becomes 1 when the data has not been updated, and it becomes 0 when the average value of the data unacquired area is updated to the size of the average value of the acquired data.

Next, using the insufficiency α(k) of updating determined by Equation 1 and the initial value ρ0(k) in the density distribution at the time of data acquisition, the density ρ(k) having been changed by the data updating is estimated by the following:

$$\rho(k) = \alpha(k) \times (\rho 0(k) - 1) + 1 \quad [\text{Eq. 2}]$$

As seen from Equation 2, the density in the case of α(k)=1 (data has not been updated) is estimated as ρ0(k), and the density in the case of α(k)=0 (data is assumed as completely updated) is estimated as 1.

In this example, there have been described the case where b(k) and c(k) are obtained by taking an average in the entire data, and α(k) becomes a constant value regardless of k. Alternatively, b(k) and c(k) may be defined in each small area obtained by delimiting the k space. That is, as shown by the small square in FIG. 5A, b(k) is defined as the average obtained by dividing the sum of the absolute values of the signal values s0(k) of the acquired data, included in the region 501 around the position k, by the number of points of the data acquired in the region 501, and c(k) is defined as the average obtained by dividing the sum of the absolute values of the signal values s(k) of the data updated in the region 501, by the number of points of the data updated in the region 501. In this case, r(k) becomes a value that varies with k.

Figure 5B:
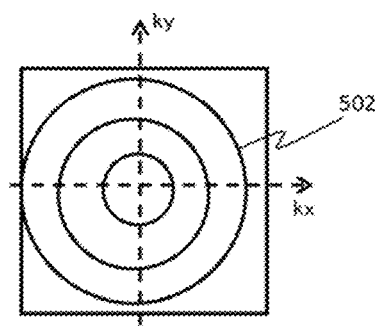
Figure 5C:
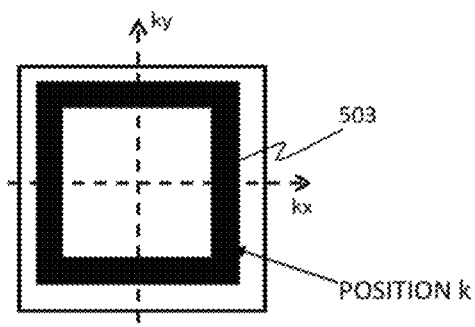
Figure 5D:
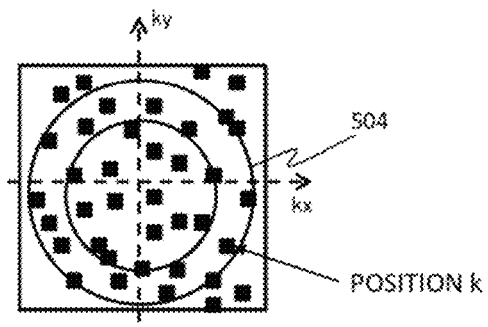

In this case, the region 501 to take the average for obtaining b(k) and c(k) may be, instead of the region in the periphery of k, a region near the sides of the square passing through k (the area represented in black) 503 as shown in FIG. 5C. If the data acquisition probability ρ0(k) as shown in FIG. 5B is given, the region 504 including near values of the probability p may also be used as shown in FIG. 5D, and any type of region may be determined freely.

The density correction unit 733 uses the density estimated by the above-described step S1037 to perform the density correction of the data in the course of the iterative operation (S1031). That is, the density of the measurement data is corrected with a density correction amount in association with the estimated density, and the process proceeds to each step being iterative. According to the present embodiment, the density is estimated based on the progress of data updating, and even in the course of iteration, it is possible to perform density correction with high accuracy based on the density with a high degree of likelihood at every time.

Figure 6A:
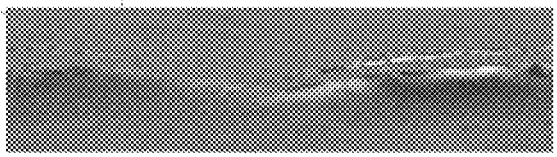
FIGS. 6A to 6E show effects of the first embodiment.
Figure 6D:
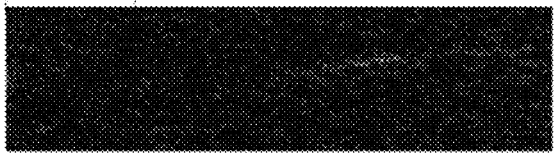
Figure 6B:
Figure 6E:
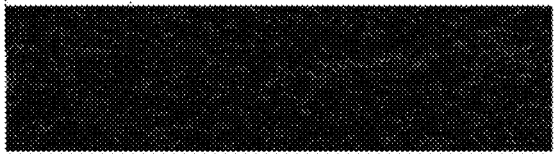
Figure 6C:

FIGS. 6A to 6E show a result of comparison between images when the density correction according to the present embodiment is performed, and when the density correction is not performed. FIG. 6A is an image when there is no shortage of data (full sampling), FIG. 6B is an image obtained by the iterative approximation without the density correction where the data is insufficient, and the image is reconstructed by ten-times iteration, and FIG. 6C is an image obtained by the iterative approximation with performing the density correction during the iteration where the data is insufficient as in the case of FIG. 6B, and the number of iterations is five.

Figure 15:
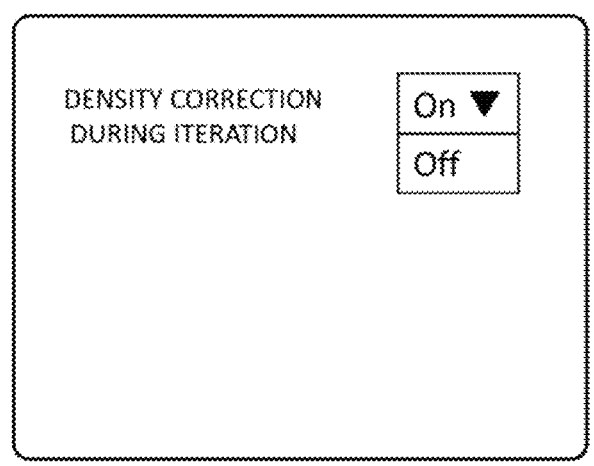
FIG. 15 illustrates an example of the UI screen of the first embodiment.

FIG. 6D shows a difference between FIG. 6A and FIG. 6B, and FIG. 6E shows a difference between FIG. 6A and FIG. 6C. As seen from the comparison between FIG. 6B and FIG. 6C or between FIG. 6D and FIG. 6E, according to the present embodiment, the image becomes closer to the image obtained by the full-sampling, by half the number of iterations relative to the case where the density correction is not performed. That is, it is found that the present embodiment improves the accuracy of image reconstruction, and the reconstructed image becomes close to the original image in a shorter time than the image reconstruction previously performed. Application of the present embodiment may be set in advance, or the user may select through the user interface (FIG. 1: the operating unit 20) whether or not the density correction is performed during the iteration. FIG. 15 illustrates a screen example of the user interface. In this example, the user is allowed to select in a pull-down selection manner whether or not to implement the density correction during the iteration.

<Modification 1 of the First Embodiment>

In the first embodiment, as the density estimation method, the progress of data updating is obtained directly from the updated data in the unacquired data area. Instead of using the updated data in the data unacquired area, the progress of data updating may be obtained indirectly from the updated data in the data acquired area.

In the present modification, the insufficiency $\alpha(k)$ of the data updating is defined as the following Equation 3, and using Equation 2 of the first embodiment, the density $\rho(k)$ is estimated.

$$\alpha(k)=\Delta b(k)/\Delta b0(k) \quad \text{[Eq. 3]}$$

where $\Delta b(k)$ is expressed by Equation 4 and $\Delta b0(k)$ is expressed by Equation 5. Here, $\Delta b(k)$ represents the sum of the absolute values of the difference between the signal value $s(k)$ of the updated data at the position k, and the signal value $s0(k)$ of the acquired data at the same position k in the data acquired area; $\Delta b0$ (k) represents the sum of the absolute values of a difference in the data acquired area, between a density-corrected value obtained by dividing the signal value $s0(k)$ of the acquired data at the position k in the data acquired area, by the density $\rho0(k)$ at the same position, and the signal value $s0(k)$.

$$\Delta b(k)=\Sigma|s(k)-s0(k)| \quad \text{[Eq. 4]}$$

$$\Delta b0(k)=\Sigma|s0(k)/\rho0(k)-s0(k)| \quad \text{[Eq. 5]}$$

The data acquired area may indicate the area across the entire k-space, or it may be a partial data acquired area including the position k.

Also in Equation 3, when the update is insufficient, $\alpha(k)$ becomes larger and approaches 1, because $s(k)$ deviates from $s0(k)$. When the data is completely updated, $s(k)$ does not deviate from $s0(k)$, and $\alpha(k)$ becomes smaller and approaches 0, thereby allowing estimation of the density using Equation 2.

<Modification 2 of the First Embodiment>

In the first embodiment, the density $\rho(k)$ estimated by Equation 2 is not distinguished between the data acquired area and the data unacquired area, but the density may be made different between the data acquired area and the data unacquired area. For example, the density may remain as 1 without any change in the data acquired area, and the density only in the data unacquired area may be set as the following Equation 6, using the update insufficiency $\alpha(k)$ as defined in Equation 1:

$$\rho(k)=1-\alpha(k) \quad \text{[Eq. 6]}$$

Alternatively, the density may be defined as the following Equation 7, and the density may be varied according to the area:

$$\rho(k)=w(k)\times\alpha(k)\times((1\times w(k))\times\rho0(k)-1)+1 \quad \text{[Eq. 7]}$$

In Equation 7, $w(k)$ is a weight in association with the area, and for example, if $w(k)=0$ in the data acquired area, and $w(k)=1$ in the data unacquired area, causing that:
$\rho(k)=1$ (data acquired area)
$\rho(k)=1-\alpha(k)$ (data unacquired area)
and this leads to the case of Equation 6.

<Modification 3 of the First Embodiment>

The density estimated in the first embodiment or in its modification 1 or 2 may be further adjusted. There are provided following methods as adjustment methods. The value of $\alpha(k)$ may be adjusted to be between or equal to 0 and 1, so as to adjust the value of $\rho(k)$ to absolutely fall into the range from $\rho0(k)$ to 1. Alternatively, adjustment may be made so that $\rho(k)$ increases monotonically, i.e., assuming the n-th estimated density at iteration as $\rho n$, $\rho(k)$ may be adjusted so that $\rho n \geq \rho n-1$ is established with respect to the density $\rho n-1$ that is estimated in the previous iteration.

With such adjustments as described above, even when the signal value of the acquired data or of the updated data contains an abnormal value due to causes such as artifacts and noise, the density estimation can be performed without accompanied by such abnormal value, enabling the density correction based on this estimation.

<Modification 4 of the First Embodiment>

In the first embodiment, the updating progress a is calculated using the data in the course of being updated, and based on this progress, the estimation of the data density in the course of the updating is performed. It is also possible to define the updating progress a by a function in which the number of iterations n of the operation is used as a variable, and to estimate the data density in the course of updating by using thus defined progress. For example, the following Equation 8 can be used as the function:

$$\alpha(n)=0.5^n \quad \text{[Eq. 8]}$$

Also in this case, the density $\rho(k)$ can be estimated by using the above-described Equation 2. The function is not limited to Equation 8, as long as the function represents a gradual decrease with the initial value as 1.

Also in the present modification, it is possible to apply Modification 2 described above. For example, the density of the data acquired area may be fixed to 1, and the density only in the data unacquired area may be made vary.

According to the present modification, it is possible to estimate the density based on a predetermined function without using the updated data, and this facilitates the density estimation.

<Modification 5 of the First Embodiment>

In the first embodiment, there has been described the case that $s(k)$ is subjected to the inverse Fourier transform after the iteration ends (S1040), thereby obtaining a final image. It is also possible to perform the density estimation of $s(k)$, then performing the density correction with thus estimated density, followed by the inverse Fourier transform to obtain the final image.

Figure 7:
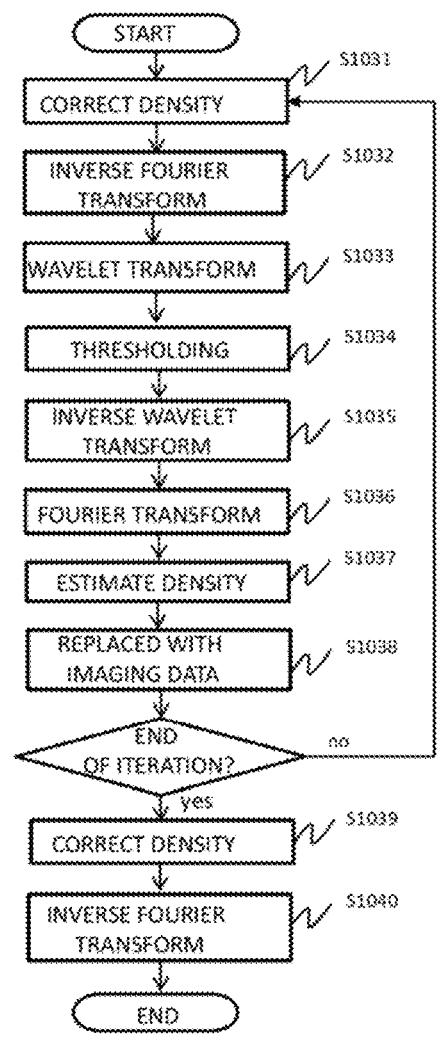
FIG. 7 is a flowchart illustrating an exemplary procedure of the iterative reconstruction according to Modification 5 of the first embodiment.

FIG. 7 is a flowchart showing the process of the present modification. Though steps up to S1038 are the same as in FIG. 4, in the present modification, the destiny estimation is performed on the measurement data obtained after the iterative operation is completed, and then there is performed the density correction based on thus estimated density. The method of the density estimation may be any of the methods in Modifications 1 to 4.

Figure 8:
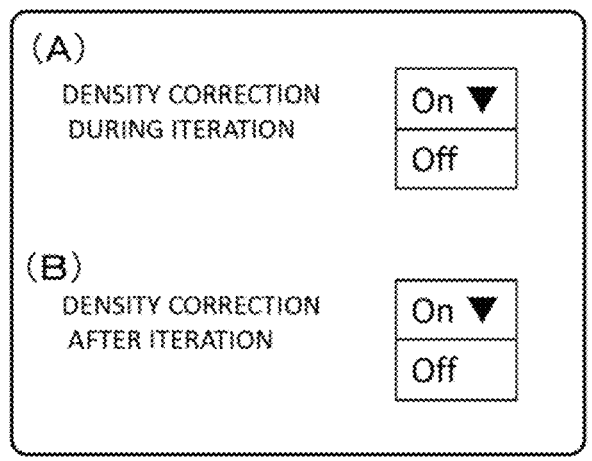
FIG. 8 shows an example of a UI screen according to Modification 5 of the first embodiment.

Application of the present modification may be set in advance, and a user may select via the user interface (FIG. 1: operating unit 20), whether to add the density correction after the iteration ends. FIG. 8 shows an example of the user interface screen. In this example, as shown in A and B, the user is allowed to select according to a pull-down selection method for each of the cases, whether or not to implement the density correction during the iteration and whether or not to implement the density correction after completion of the iteration.

According to the present modification, even when sufficient convergence has not been achieved by the iterative process, an image quality can be improved by performing the density correction. Therefore, it is possible to obtain a good approximate image with even less iterations. By enabling the user selection, it is possible to carry out image reconstruction according to the user's desire, such as placing a priority on the image quality or on the time required for generating the image.

Second Embodiment

In the first embodiment, there is performed the reconstruction where the process to perform density correction on the data s(k) every iteration is added to the iterative operation of the iterative approximation generally used. In the present embodiment, the iterative approximation unit 731 employs a high-speed Alternating Split Bregman method for the iterative process. Also in the present embodiment, the density correction is added in the iterative process as in the case of the first embodiment. The present embodiment, however, is different in the point that the processing is entirely changed, unlike the processing as shown in FIG. 4 where the step of performing the density correction on data s(k) (S1031) is added to the procedure.

There will now be described the iterative approximation according to the Alternating Split Bregman method that is employed in the present embodiment.

The image reconstruction according to this iterative approximation is a process using the wavelet transform or the curvelet transform, to perform L1-norm minimization on the measurement data having been obtained as image spatial data by the inverse Fourier transform, so as to obtain a reconstructed image, and it is a process to solve the problem represented by Equation 9 as the following:

[Eq. 9]

$$\operatorname*{argmin}_{u, \vartheta_c, \vartheta_w}\{\|\Lambda_c \vartheta_c\|_1 + \|\Lambda_w \vartheta_w\|_1\} \quad (9)$$

s.t. there exists an $u \in \mathbb{R}^N$ with $f = \Phi u$,
$\vartheta_c = \Psi_c u,$
$\vartheta_w = \Psi_w u,$ In Equation 9, f is imaging data, u is a reconstructed image, $\Phi$ is a transform representing Fourier transform to extract only the data acquired area, $\Psi c$ is the curvelet transform, $\Psi w$ is the wavelet transform, $\theta c$ is a wavelet transform coefficient, $\theta w$ is a wavelet transform coefficient, $\Lambda c$ is a weight set to the curvelet coefficient, and $\Lambda w$ is a weight set to the wavelet coefficient.

According to the Bregman method, this problem is replaced by iterative solving of Equation 10 as the following. In the following equation, the superscription letter "n" represents the number of iterations (hereinafter the same):

[Eq. 10]

$$(u^{n+1}, \vartheta_c^{n+1}, \vartheta_w^{n+1}) = \operatorname*{argmin}_{u, \vartheta_c, \vartheta_w}\{D_E^p((\vartheta_c, \vartheta_w), (\vartheta_c^n, \vartheta_w^n)) + \frac{1}{2}\|\Phi u - f\|_2^2 + \frac{\mu}{2}(\|\Psi_c u - \vartheta_c\|_2^2 + \|\Psi_w u - \vartheta_w\|_2^2)\} = \operatorname*{argmin}_{u, \vartheta_c, \vartheta_w}\{E(\vartheta_c, \vartheta_w) - \langle p_c^n, \vartheta_c\rangle - \langle p_w^n, \vartheta_w\rangle + \frac{1}{2}\|\Phi u - f\|_2^2 + \frac{\mu}{2}(\|\Psi_c u - \vartheta_c\|_2^2 + \|\Psi_w u - \vartheta_w\|_2^2)\} \quad (10)$$

where $u^n, \vartheta_c^n, \vartheta_w^n$ are solutions of $u, \vartheta_c, \vartheta_w$ at the n-th iteration, $D_E^p(\vartheta_c, \vartheta_w),(\vartheta_c^n, \vartheta_w^n))$ represents the Bregman distance, and that is defined as $D_E^p(x,y)=E(x)\cdot E(y)\cdot(p,x\cdot y)$. $E(\vartheta_c, \vartheta_w)$ is defined as $E(\vartheta_c, \vartheta_w)=\|\Lambda_c \vartheta_c\|_2+\|\Lambda_w \vartheta_w\|_1$, and $(p_c^n, p_w^n)$ is a subgradient of E at $(\vartheta_c^n, \vartheta_w^n)$. Here, $\mu$ is a weight of the term and it takes a value larger than zero.

Equation 10 is further replaced by the following Equation 11 according to the Split Bregman method:

[Eq. 11]

$$\begin{cases} (u^{n+1}, \vartheta_c^{n+1}, \vartheta_w^{n+1}) = \operatorname*{argmin}_{u, \vartheta_c, \vartheta_w}\{E(\vartheta_c, \vartheta_w) + \frac{1}{2}\|\Phi u - f\|_2^2 + \frac{\mu}{2}(\|\vartheta_c - \Psi_c u - b_c^n\|_2^2 + \|\vartheta_w - \Psi_w u - b_w^n\|_2^2)\} \\ b_c^{n+1} = b_c^n + \Psi_c u^{n+1} - \vartheta_c^{n+1} \\ b_w^{n+1} = b_w^n + \Psi_w u^{n+1} - \vartheta_w^{n+1} \\ f^{n+1} = f^n + f - \Phi u^{n+1} \end{cases} \quad (11)$$

where $b_c^n = \frac{1}{\mu} p_c^n,$ $b_w^n = \frac{1}{\mu} p_w^n$

Equation 11 may further be replaced by the following Equations 12-1 to 12-6 according to the Alternating Split Bregman method:

[Eq. 12-1 to Eq. 12-6]

$$\begin{cases} u^{n+1} = \underset{u}{\mathrm{argmin}}\left\{\frac{1}{2}\|\Phi u - f\|_2^2 + \frac{\mu}{2}(\|\vartheta_c^n - \Psi_c u - b_c^n\|_2^2 + \|\vartheta_w^n - \Psi_w u - b_w^n\|_2^2)\right\} & (12\text{-}1) \\ \vartheta_c^{n+1} = \underset{\vartheta_c}{\mathrm{argmin}}\left\{\|\Lambda_c \vartheta_c\|_1 + \frac{\mu}{2}\|\vartheta_c - \Psi_c u^{n+1} - b_c^n\|_2^2\right\} & (12\text{-}2) \\ \vartheta_w^{n+1} = \underset{\vartheta_w}{\mathrm{argmin}}\left\{\|\Lambda_w \vartheta_w\|_1 + \frac{\mu}{2}\|\vartheta_w - \Psi_w u^{n+1} - b_w^n\|_2^2\right\} & (12\text{-}3) \\ b_c^{n+1} = b_c^n + \Psi_c u^{n+1} - \vartheta_c^{n+1} & (12\text{-}4) \\ b_w^{n+1} = b_w^n + \Psi_w u^{n+1} - \vartheta_w^{n+1} & (12\text{-}5) \\ f^{n+1} = f^n + f - \Phi u^{n+1} & (12\text{-}6) \end{cases}$$

Optimization problems of u, θc, and θw, respectively expressed by Equations (12-1) to (12-3), can be solved analytically.

Figure 9:
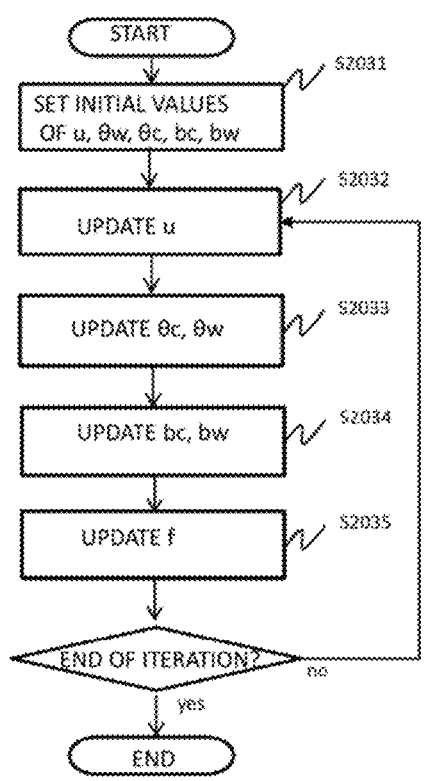
FIG. 9 is a flowchart showing steps of the iterative reconstruction using the Alternating Split Bregman method.

FIG. 9 shows the image generation process (FIG. 3: S103) according to this Alternating Split Bregman method. First, initial values of u, θw, θc, bc, and bw are provided (S2031). The initial values may be 0, for example. Then, u is updated by Equation (12-1) (S2032). Next, θc is updated by Equation (12-2), and θw is updated by Equation (12-3) (S2033). Next, bc is updated by Equation (12-4), and bw is updated by Equation (12-5) (S2034). Next, f is updated by Equation (12-6) (S2035). If the solution u is not convergent, the process returns to S2032 and then repeated. The process ends, when the solution u convergent.

In the present embodiment, the density correction is introduced into this process. Therefore, first, Equation 10 for obtaining u, θc, and θw is changed to Equation 13 as the following:

[Eq. 13]

$$(u^{n+1}, \vartheta_c^{n+1}, \vartheta_w^{n+1}) = \underset{u,\vartheta_c,\vartheta_w}{\mathrm{argmin}}\left\{D_E^p((\vartheta_c, \vartheta_w), (\vartheta_c^n, \vartheta_w^n)) + \frac{1}{2}\|\Phi F u - f\|_2^2 + \right. \tag{13}$$

$$\left. \frac{\mu}{2}(\|\Psi_c F^{-1}(\Omega^n)^{-1} F u - \vartheta_c\|_2^2 + \|\Psi_w F^{-1}(\Omega^n)^{-1} F u - \vartheta_w\|_2^2)\right\} =$$

$$\underset{u,\vartheta_c,\vartheta_w}{\mathrm{argmin}}\left\{E(\vartheta_c, \vartheta_w) - \langle p_c^n, \vartheta_c \rangle - \langle p_w^n, \vartheta_w \rangle + \right.$$

$$\left. \frac{1}{2}\|\Phi F u - f\|_2^2 + \frac{\mu}{2}(\|\Psi_c F^{-1}(\Omega^n)^{-1} F u - \vartheta_c\|_2^2 + \|\Psi_w F^{-1}(\Omega^n)^{-1} F u - \vartheta_w\|_2^2)\right\}$$

In Equation 13, F represents the Fourier transform, the notation Φ is changed from that of Equation 10, Φ is a transform that does not include the Fourier transform and extracts only the data acquired area, and $(\Omega^n)^{-1}$ represents the density correction process. A method of the density correction is the same as the method described in the first embodiment, and the density correction is based on the estimated density from the data ($Fu^n$) obtained by the n-th iteration, or the estimated density determined by the number of iterations n. Any value may be taken as $\Omega^n$ and shall not depend on u. The weight of the term is represented as μ, taking a value greater than 0.

Here, in the density estimation for determining the density correction amount of $(\Omega^n)^{-1}$, if the density becomes 1 at a certain n-th or subsequent times, indicating the density correction is not performed, this causes convergence to the same solution as in Equation 9. Thus, it is possible to solve the Equation 9 by Equation 13. Even in the case where the density does not become 1, no matter how large value is given to n, if $\Omega^n$ becomes $\Omega^\infty$ at a certain n-th or subsequent times, this causes convergence to the solution of Equation 14, which is a variant of Equation 9. That is, as far as $\Omega^n$ is convergent as in the case of Modification 3 of the first embodiment, the solution of Equation 13 is assured to converge.

[Eq. 14]

$$\underset{u,\vartheta_c,\vartheta_w}{\mathrm{argmin}}\{\|\Lambda_c \vartheta_c\|_1 + \|\Lambda_w \vartheta_w\|_1\} \tag{14}$$

$$\text{s.t. there exists an } u \in \mathbb{R}^N \text{ with } f = \Phi u,$$

$$\vartheta_c = \Psi_c F^{-1}(\Omega^\infty)^{-1} F u,$$

$$\vartheta_w = \Psi_w F^{-1}(\Omega^\infty)^{-1} F u$$

In the present embodiment, by replacing Equation 13 with Equations 15-1 to 15-4 as the following, it is possible to obtain the same combination (sequence) of solutions $\{(u^1, \theta^1c, \theta^1w) (u^2, \theta^2c, \theta^2w) (u^3, \theta^3c, \theta^3w) \ldots\}$ as obtained by Equation 13. The values of u, θc, θw, f, bc, and bw may be vectors as real numbers, or they may be complex numbers such as a matrix of n rows and two columns, using a matrix representation of complex numbers.

[Eq. 15-1 to Eq. 15-4]

$$\begin{cases} (u^{n+1}, \vartheta_c^{n+1}, \vartheta_w^{n+1}) = \underset{u,\vartheta_c,\vartheta_w}{\operatorname{argmin}}\Big\{ E(\vartheta_c, \vartheta_w) + \frac{1}{2}\|\Phi F u - f^n\|_2^2 + \frac{\mu}{2}\big(\|\vartheta_c - \Psi_c F^{-1}(\Omega^n)^{-1} F u - b_c^n\|_2^2 + \|\vartheta_w - \Psi_w F^{-1}(\Omega^n)^{-1} F u - b_w^n\|_2^2\big)\Big\} & (15\text{-}1) \\ b_c^{n+1} = b_c^n + \Psi_c F^{-1}(\Omega^n)^{-1} F u^{n+1} - \vartheta_c^{n+1} & (15\text{-}2) \\ b_w^{n+1} = b_w^n + \Psi_w F^{-1}(\Omega^n)^{-1} F u^{n+1} - \vartheta_w^{n+1} & (15\text{-}3) \\ f^{n+1} = \Phi(\Omega^{n+1})^{-1}\Omega^n\Phi^T f^n + f - \Phi(\Omega^{n+1})^{-1}\Omega^n\Phi^T \Phi F u^{n+1} & (15\text{-}4) \end{cases}$$

It is to be noted that the fixed point due to this iteration is definitely a solution of Equation 13.

Furthermore, Equation 15-1 is changed to Equations 16-1 to 16-3, and optimized in the order of u, θc, and θw. Equations 16-4 to 16-6 are the same as Equations 15-2 to 15-4:

[Eq. 16-1 to Eq. 16-6]

$$\begin{cases} u^{n+1} = \underset{u}{\operatorname{argmin}}\Big\{\frac{1}{2}\|\Phi F u - f^n\|_2^2 + \frac{\mu}{2}\big(\|\vartheta_c^n - \Psi_c F^{-1}(\Omega^n)^{-1} F u - b_c^n\|_2^2 + \|\vartheta_w^n - \Psi_w F^{-1}(\Omega^n)^{-1} F u - b_w^n\|_2^2\big)\Big\} & (16\text{-}1) \\ \vartheta_c^{n+1} = \underset{\vartheta_c}{\operatorname{argmin}}\Big\{\|\Lambda_c \vartheta_c\|_1 + \frac{\mu}{2}\|\vartheta_c - \Psi_c F^{-1}(\Omega^n)^{-1} F u^{n+1} - b_c^n\|_2^2\Big\} & (16\text{-}2) \\ \vartheta_w^{n+1} = \underset{\vartheta_w}{\operatorname{argmin}}\Big\{\|\Lambda_w \vartheta_w\|_1 + \frac{\mu}{2}\|\vartheta_w - \Psi_w F^{-1}(\Omega^n)^{-1} F u^{n+1} - b_w^n\|_2^2\Big\} & (16\text{-}3) \\ b_c^{n+1} = b_c^n + \Psi_c F^{-1}(\Omega^n)^{-1} F u^{n+1} - \vartheta_c^{n+1} & (16\text{-}4) \\ b_w^{n+1} = b_w^n + \Psi_w F^{-1}(\Omega^n)^{-1} F u^{n+1} - \vartheta_w^{n+1} & (16\text{-}5) \\ f^{n+1} = \Phi(\Omega^{n+1})^{-1}\Omega^n\Phi^T f^n + f - \Phi(\Omega^{n+1})^{-1}\Omega^n\Phi^T \Phi F u^{n+1} & (16\text{-}6) \end{cases}$$

Specifically, Equation 16-1 is changed to the following:

[Eq. 17]

$$u^{n+1} = F^T \frac{1}{2\mu}(\Omega^n)^2 (I_N - \Xi^n)\Phi^T f^n + F^T \frac{\Omega^n}{2}(I_N - \Xi^n \Phi^T \Phi) F(\Psi_c^T(\vartheta_c^n - b_c^n) + \Psi_w^T(\vartheta_w^n - b_w^n)) \quad (17)$$

where superscript T of $F^T$, $\Phi^T$ indicates a transposed matrix, and $I_N$ indicates a unit matrix, representing the following:

$$\Omega^n = \begin{pmatrix} \omega_1^n & 0 & 0 \\ 0 & \ddots & 0 \\ 0 & 0 & \omega_N^n \end{pmatrix}$$

$$\Xi^n := \begin{pmatrix} \frac{\omega_1^{n^2}}{\omega_1^{n^2} + 2\mu} & 0 & 0 \\ 0 & \ddots & 0 \\ 0 & 0 & \frac{\omega_N^{n^2}}{\omega_N^{n^2} + 2\mu} \end{pmatrix}$$

Specifically, Equations 16-2 and 16-3 are changed to Equation 18 as the following:

[Eq. 18]

$$\vartheta_{c,l}^{n+1} = \begin{cases} (\Psi_c u^{n+1})_l + b_{c,l}^n - \frac{|\lambda_{c,l}|}{\mu} & \text{if } (\Psi_c u^{n+1})_l + b_{c,l}^n \geq \frac{|\lambda_{c,l}|}{\mu} \\ (\Psi_c u^{n+1})_l + b_{c,l}^n + \frac{|\lambda_{c,l}|}{\mu} & \text{if } (\Psi_c u^{n+1})_l + b_{c,l}^n \leq -\frac{|\lambda_{c,l}|}{\mu} \\ 0 & \text{if } |(\Psi_c u^{n+1})_l + b_{c,l}^n| < \frac{|\lambda_{c,l}|}{\mu} \end{cases} \quad (18)$$

$$\vartheta_{w,l}^{n+1} = \begin{cases} (\Psi_w u^{n+1})_l + b_{w,l}^n - \frac{|\lambda_{w,l}|}{\mu} & \text{if } (\Psi_w u^{n+1})_l + b_{w,l}^n \geq \frac{|\lambda_{w,l}|}{\mu} \\ (\Psi_w u^{n+1})_l + b_{w,l}^n + \frac{|\lambda_{w,l}|}{\mu} & \text{if } (w_w u^{n+1})_l + b_{w,l}^n \leq -\frac{|\lambda_{w,l}|}{\mu} \\ 0 & \text{if } |(\Psi_w u^{n+1})_l + b_{w,l}^n| < \frac{|\lambda_{w,l}|}{\mu} \end{cases}$$

where
$\vartheta_{c,l}^{n+1}$、$(\Psi_c u^{n+1})_l$、$b_{c,l}^n$、$\lambda_{c,l}$、$\vartheta_{w,l}^{n+1}$、$(\Psi_w u^{n+1})_l$、$b_{w,l}^n$、$\lambda_{w,l}$ are respectively the l-th elements of $\vartheta_c^{n+1}$、$\Psi_c u^{n+1}$、$b_c^n$、$\lambda_c$、$\vartheta_w^{n+1}$、$\Psi_w u^{n+1}$、$b_w^n$、$\lambda_w$.

Figure 10:
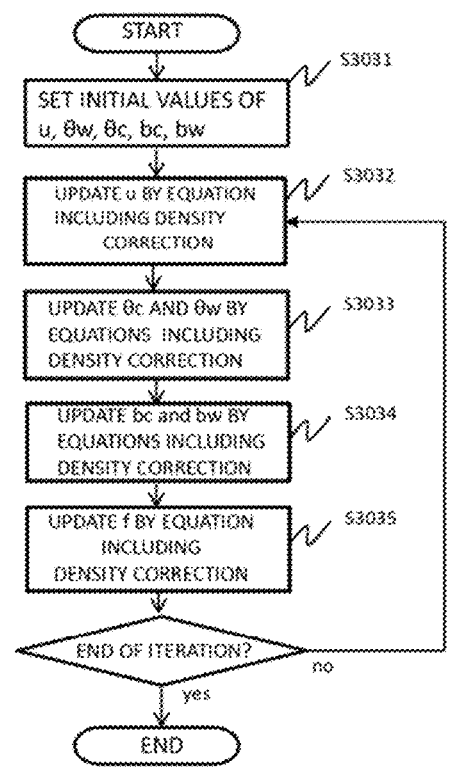
FIG. 10 is a flowchart illustrating an exemplary procedure of the iterative reconstruction according to a second embodiment.

FIG. 10 is a flowchart of the image generation process (S103) of the present embodiment in which the density correction process described above (the process based on Equation 16) is introduced.

First, initial values of u, θw, θc, bc, and bw are provided (S3031). This step is the same as step S2031 of FIG. 9, and the initial values may be zero, for example. Then, u is updated in Equation (16-1) including the density correction (S3032). Next, θc and θw are updated respectively in Equation (16-2) and Equation (16-3), including the density correction (S3033). Next, bc and bw are updated respectively in Equation (16-4) and Equation (16-5), including the density correction (S3034). Next, f is updated in Equation (16-6) including the density correction (S3035). If the solution u is not convergent, the process returns to S3032 and it is then repeated. The process ends when the solution u convergent.

Variables (θc, θw, bc, bw) to be updated at each iteration may also be changed to Equation 19 as the following. The left-hand side of the third and fourth expressions are described as $b(\sim)^n_c$ and $b(\sim)^n_w$ in the text of the specification:

[Eq. 19]

$$u_c^n := \Psi_c^T \vartheta_c^n$$
$$u_w^n := \Psi_w^T \vartheta_w^n$$
$$\tilde{b}_c^n := \Psi_c^T b_c^n$$
$$\tilde{b}_w^n := \Psi_w^T b_w^n \qquad (19)$$

In that case, Equations 16-1 to 16-6 are changed to the following:

[Eq. 20-1 to Eq. 20-6]

$$\begin{cases} u^{n+1} = \underset{u}{\mathrm{argmin}} \left\{ \frac{1}{2} \|\Phi F u - f^n\|_2^2 + \frac{\mu}{2} \left( \|\Psi_c u_c^n - \Psi_c F^{-1}(\Omega^n)^{-1} F u - \Psi_c \tilde{b}_c^n\|_2^2 + \|\Psi_w u_w^n - \Psi_w F^{-1}(\Omega^n)^{-1} F u - \Psi_w \tilde{b}_w^n\|_2^2 \right) \right\} & (20\text{-}1) \\ u_c^{n+1} = \underset{u_c}{\mathrm{argmin}} \left\{ \|\Lambda_c \Psi_c u_c\|_1 + \frac{\mu}{2} \|\Psi_c u_c - \Psi_c F^{-1}(\Omega^n)^{-1} F u^{n+1} - \Psi_c \tilde{b}_c^n\|_2^2 \right\} & (20\text{-}2) \\ u_w^{n+1} = \underset{u_w}{\mathrm{argmin}} \left\{ \|\Lambda_w \Psi_w u_w\|_1 + \frac{\mu}{2} \|\Psi_w u_w - \Psi_w F^{-1}(\Omega^n)^{-1} F u^{n+1} - \Psi_w \tilde{b}_w^n\|_2^2 \right\} & (20\text{-}3) \\ \tilde{b}_c^{n+1} = \tilde{b}_c^n + F^{-1}(\Omega^n)^{-1} F u^{n+1} - u_c^{n+1} & (20\text{-}4) \\ \tilde{b}_w^{n+1} = \tilde{b}_w^n + F^{-1}(\Omega^n)^{-1} F u^{n+1} - u_w^{n+1} & (20\text{-}5) \\ f^{n+1} = \Phi(\Omega^{n+1})^{-1} \Omega^n \Phi^T f^n + f - \Phi(\Omega^{n+1})^{-1} \Omega^n \Phi^T \Phi u^{n+1} & (20\text{-}6) \end{cases}$$

Equation 17 is changed to Equation 21 as the following:

[Eq. 21]

$$u^{n+1} = F^T \frac{1}{2\mu}(\Omega^n)^2 (I_N - \Xi^n) \Phi^T f^n + \qquad (21)$$
$$F^T \frac{\Omega^n}{2}(I_N - \Xi^n \Phi^T \Phi) F\left((u_c^n - \tilde{b}_c^n) + (u_w^n - \tilde{b}_w^n)\right) =$$
$$F^T \left( \frac{1}{2\mu}(\Omega^n)^2 (I_N - \Xi^n) \Phi^T f^n + \right.$$
$$\left. \frac{\Omega^n}{2}(I_N - \Xi^T \Phi^T \Phi) F\left((u_c^n - \tilde{b}_c^n) + (u_w^n - \tilde{b}_w^n)\right) \right)$$

Equation 18 is changed to Equation 22 as the following:

[Eq. 22]

$$u_c^{n+1} = \Psi_c^T \vartheta_c^{n+1} \qquad (22)$$

$$\vartheta_{c,l}^{n+1} = \begin{cases} (\Psi_c(u^{n+1} + \tilde{b}_c^n))_l - \frac{|\lambda_{c,l}|}{\mu} & \text{if } (\Psi_c(u^{n+1} + \tilde{b}_c^n))_l \geq \frac{|\lambda_{c,l}|}{\mu} \\ (\Psi_c(u^{n+1} + \tilde{b}_c^n))_l + \frac{|\lambda_{c,l}|}{\mu} & \text{if } (\Psi_c(u^{n+1} + \tilde{b}_c^n))_l \leq -\frac{|\lambda_{c,l}|}{\mu} \\ 0 & \text{if } |(\Psi_c(u^{n+1} + \tilde{b}_c^n))_l| < \frac{|\lambda_{c,l}|}{\mu} \end{cases}$$

$$u_w^{n+1} = \Psi_w^T \vartheta_w^{n+1}$$
$$\vartheta_{w,l}^{n+1} = $$
$$\begin{cases} (\Psi_w(u^{n+1} + \tilde{b}_w^n))_l - \frac{|\lambda_{w,l}|}{\mu} & \text{if } (\Psi_w(u^{n+1} + \tilde{b}_w^n))_l \geq \frac{|\lambda_{w,l}|}{\mu} \\ (\Psi_w(u^{n+1} + \tilde{b}_w^n))_l + \frac{|\lambda_{w,l}|}{\mu} & \text{if } (\Psi_w(u^{n+1} + \tilde{b}_w^n))_l \leq -\frac{|\lambda_{w,l}|}{\mu} \\ 0 & \text{if } |(\Psi_w(u^{n+1} + \tilde{b}_w^n))_l| < \frac{|\lambda_{w,l}|}{\mu} \end{cases}$$

where
$\vartheta_{c,l}^{n+1}$、$(\Psi_c(u^{n+1} + \tilde{b}_c^n))_l$、$\lambda_{c,l}$、$\vartheta_{w,l}^{n+1}$、$(\Psi_w(u^{n+1} + \tilde{b}_w^n))_l$、$\lambda_{w,l}$ are respectively the l-th elements of $\vartheta_c^{n+1}$、$\Psi_c(u^{n+1} + \tilde{b}_c^n)$、$\lambda_c$、$\vartheta_w^{n+1}$、$\Psi_w(u^{n+1} + \tilde{b}_w^n)$、$\lambda_w$.

Figure 11:
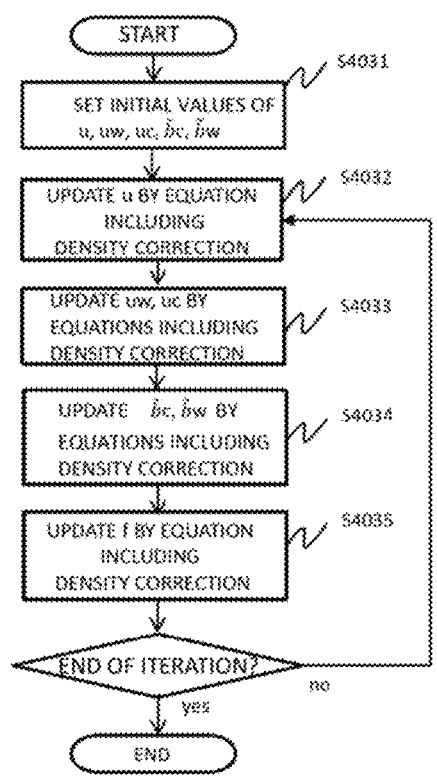
FIG. 11 is a flowchart illustrating another example of the procedure of the iterative reconstruction according to the second embodiment.

FIG. 11 is the flowchart of the image generation process (S103) for the case above. First, initial values of u, uw, uc, $b(\sim)^n_c$, and $b(\sim)^n_w$ are provided (S4031). The initial values may be zero, for example. Then, u is updated by Equation (20-1) including the density correction (S4032). Then, uc is updated by Equation (20-2) including the density correction, and uw is updated by Equation (20-3) including the density correction (S4033). Next, updates $b(\sim)^n_c$ is updated by Equation (20-4) including the density correction, and $b(\sim)^n_w$ is updated by Equation (20-5) including the density correction (S4034). Next, f is updated by Equation (20-6) including the density correction (S4035). If the solution u is not convergent, the process returns to S4032 and then it is repeated. The process ends when the solution u is convergent.

<Modification 1 of the Second Embodiment>

In the second embodiment, as shown in Equation 14, the density correction $(\Omega)^{-1}$ is performed prior to performing the wavelet transform or the curvelet transform (i.e. transform to the space for L1-norm minimization), but the measurement data may be subjected to the density correction in the condition of f=Φu, that data of the data acquired area among Fourie transformed data of reconstructed image matches with the measurement data. In this case, instead of adding the density correction $\Omega$ as a term of the curvelet transform or the wavelet transform in Equation 13 of the second embodiment, it is added into the term of |ΦFu−f| as in the following:

[Eq. 23]

$$(u^{n+1}, \vartheta_c^{n+1}, \vartheta_w^{n+1}) = \qquad (23)$$
$$\operatorname*{argmin}_{u,\vartheta_c,\vartheta_w}\left\{D_E^p((\vartheta_c, \vartheta_w), (\vartheta_c^n, \vartheta_w^n)) + \frac{1}{2}\|\Phi\Omega^n Fu - f\|_2^2 + \right.$$
$$\left.\frac{\mu}{2}(\|\Psi_c u - \vartheta_c\|_2^2 + \|\Psi_w u - \vartheta_w\|_2^2)\right\} =$$
$$\operatorname*{argmin}_{u,\vartheta_c,\vartheta_w}\left\{E(\vartheta_c, \vartheta_w) - \langle p_c^n, \vartheta_c\rangle - \langle p_w^n, \vartheta_w\rangle + \frac{1}{2}\|\Phi\Omega^n Fu - f\|_2^2 + \right.$$
$$\left.\frac{\mu}{2}(\|\Psi_c u - \vartheta_c\|_2^2 + \|\Psi_w u - \vartheta_w\|_2^2)\right\}$$

The flowchart of this case is the same as the flowcharts as shown in FIGS. 10 and 11.

<Modification 2 of the Second Embodiment>

Also in the second embodiment, similarly to Modification 5 of the first embodiment, before obtaining a final image from the measurement data after the iteration ends, the density correction is performed on the measurement data obtained at the end of iteration, and then subjected to the inverse Fourier transform, so as to obtain the final image.

Figure 12:
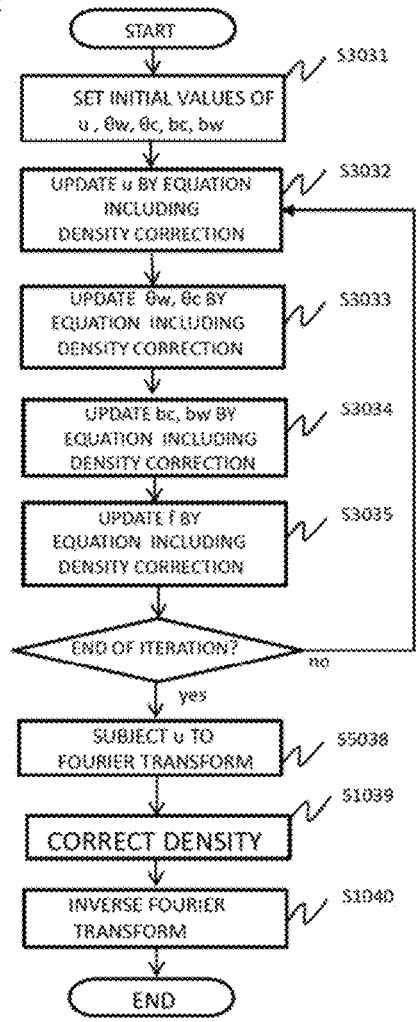
FIG. 12 is a flowchart illustrating an exemplary procedure of the iterative reconstruction according to a modification of the second embodiment.
Figure 13:
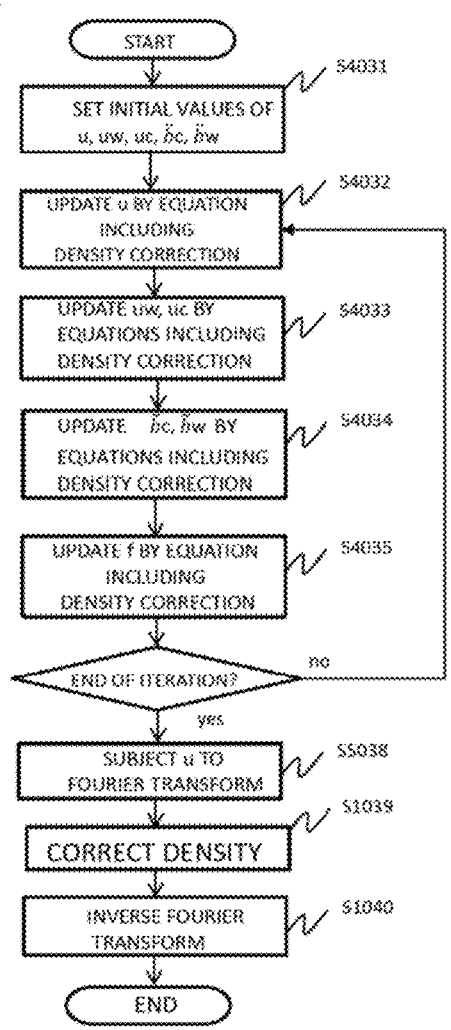
FIG. 13 is a flowchart showing another example of the procedure of the iterative reconstruction according to the modification of the second embodiment.

In this case, as shown in FIGS. 12 and 13, the process of subjecting u to the Fourier transform (S5038), the density correction (S1039), and the inverse Fourier transform (S1040) are added after the end of the iteration as shown in FIGS. 10 and 11. As the method of the density estimation, any of the methods according to the first embodiment and Modifications 1 to 4 thereof may be used.

According to the present modification, even when sufficient convergence is not achieved by the iterative process, an image quality can be improved by performing the density correction. Therefore, it is possible to obtain a good approximate image with even less iteration.

Figure 14:
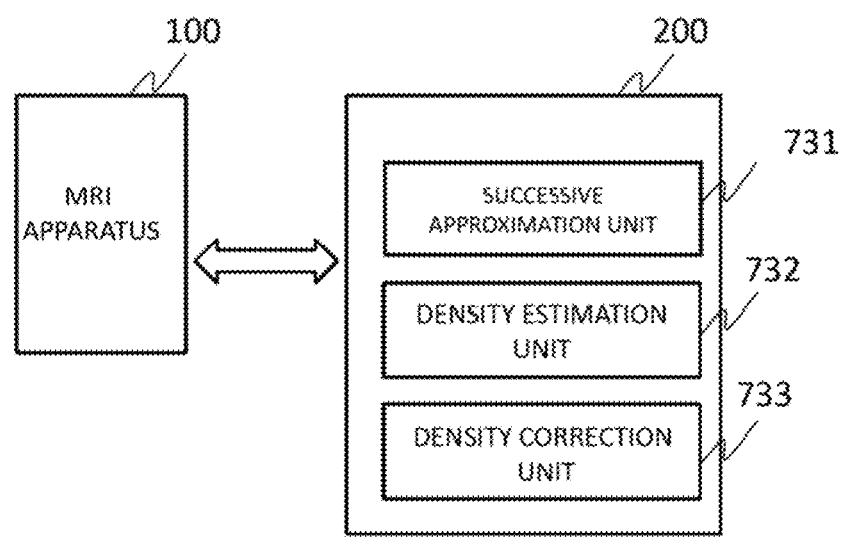
FIG. 14 is a configuration diagram of an image processor.

There have been described the embodiments in which the signal processing unit 7 (the image generation unit) of the MRI apparatus implements the image processing of the present invention. As shown in FIG. 14, it is also possible to implement the functions of the image generation unit 73 by an image processor 200 that is independent of the MRI apparatus 100. The image processor 200 may be connected to the MRI apparatus 100, being wired, wirelessly, or via the Internet line, or alternatively it may use a portable medium, to receive the measurement data obtained by the imaging unit of the MRI apparatus 100, so as to perform an image reconstruction operation. The image thus generated may be displayed on a display attached to the image processor 200, stored in a storage device, or it may be transferred to the MRI apparatus 100.

DRAWINGS

FIG. 1
4 SEQUENCER
8 CENTRAL PROCESSING UNIT (CPU)
10 GRADIENT MAGNETIC FILED POWER SOURCE
11 RF OSCILLATOR
12 MODULATOR
14a TRANSMITTING COIL
14b RECEIVING COIL
16 QUADRATURE PHASE DETECTOR
18 EXTERNAL STORAGE DEVICE
19 DISPLAY
20 OPERATING UNIT
FIG. 2
7(8) SIGNAL PROCESSING UNIT
71 IMAGING SETTING UNIT
73 IMAGE GENERATION UNIT
731 ITERATIVE APPROXIMATION UNIT
732 DENSITY ESTIMATION UNIT
733 DENSITY CORRECTION UNIT
FIG. 3
START
S101 PLACE SUBJECT
S102 PERFORM IMAGING
S103 GENERATE IMAGE (DENSITY CORRECTION PROCESS)
END
FIG. 4
S103 START
S1031 CORRECT DENSITY
S1032 INVERSE FOURIER TRANSFORM
S1033 WAVELET TRANSFORM
S1034 THRESHOLDING PROCESS
S1035 INVERSE WAVELET TRANSFORM
S1036 FOURIER TRANSFORM
S1037 ESTIMATE DENSITY
S1038 REPLACED WITH IMAGING DATA
END OF ITERATION?
S1040 INVERSE FOURIER TRANSFORM
END
FIG. 5A
POSITION k
FIG. 5C
POSITION k
FIG. 5D
POSITION k
FIG. 7
S103 START
S1031 CORRECT DENSITY
S1032 INVERSE FOURIER TRANSFORM
S1033 WAVELET TRANSFORM
S1034 THRESHOLDING PROCESS
S1035 INVERSE WAVELET TRANSFORM
S1036 FOURIER TRANSFORM
S1037 ESTIMATE DENSITY
S1038 REPLACED WITH IMAGING DATA
END OF ITERATION?
S1039 CORRECT DENSITY
S1040 INVERSE FOURIER TRANSFORM
END
FIG. 8
(A) DENSITY CORRECTION DURING ITERATION
(B) DENSITY CORRECTION AFTER ITERATION
FIG. 9
START
S2031 SET INITIAL VALUES OF u, θw, θc, bc, and bw S2032 UPDATE u
S2033 UPDATE θc AND θw
S2034 UPDATE bc and bw
S2035 UPDATE f
END OF ITERATION?
END
FIG. 10
START
S3031 SET INITIAL VALUES OF u, θw, θc, bc, and bw
S3032 UPDATE u BY EQUATION INCLUDING DENSITY CORRECTION
S3033 UPDATE θc AND θw BY EQUATIONS INCLUDING DENSITY CORRECTION
S3034 UPDATE bc and bw BY EQUATIONS INCLUDING DENSITY CORRECTION
S3035 UPDATE f BY EQUATION INCLUDING DENSITY CORRECTION
END OF ITERATION?
END
FIG. 11
START
S4031 SET INITIAL VALUES OF u, uw, uc, b(~)c, AND b(~)w
S4032 UPDATE u BY EQUATION INCLUDING DENSITY CORRECTION
S4033 UPDATE uw AND uc BY EQUATIONS INCLUDING DENSITY CORRECTION
S4034 UPDATE b(~)c and b(~)w BY EQUATIONS INCLUDING DENSITY CORRECTION
S4035 UPDATE f BY EQUATION INCLUDING DENSITY CORRECTION
END OF ITERATION?
END
FIG. 12
START
S3031 SET INITIAL VALUES OF u, θw, θc, bc, and bw
S3032 UPDATE u BY EQUATION INCLUDING DENSITY CORRECTION
S3033 UPDATE θc AND θw BY EQUATIONS INCLUDING DENSITY CORRECTION
S3034 UPDATE bc and bw BY EQUATIONS INCLUDING DENSITY CORRECTION
S3035 UPDATE f BY EQUATION INCLUDING DENSITY CORRECTION
END OF ITERATION?
S5038 SUBJECT u TO FOURIER TRANSFORM
S1039 CORRECT DENSITY
S1040 INVERSE TRANSFORM
END
FIG. 13
START
S4031 SET INITIAL VALUES OF u, uw, uc, b(~)c, AND b(~)w
S4032 UPDATE u BY EQUATION INCLUDING DENSITY CORRECTION
S4033 UPDATE uw AND uc BY EQUATIONS INCLUDING DENSITY CORRECTION
S4034 UPDATE b(~)c and b(~)w BY EQUATIONS INCLUDING DENSITY CORRECTION
S4035 UPDATE f BY EQUATION INCLUDING DENSITY CORRECTION
END OF ITERATION?
S5038 SUBJECT u TO FOURIER TRANSFORM
S1039 CORRECT DENSITY
S1040 INVERSE TRANSFORM
END
FIG. 14
100 MRI APPARATUS
731 ITERATIVE APPROXIMATION UNIT
732 DENSITY CORRECTION UNIT
733 DENSITY ESTIMATION UNIT
FIG. 15
DENSITY CORRECTION DURING ITERATION

What is claimed is:

1. A magnetic resonance imaging apparatus comprising:
an imaging unit configured to acquire measurement data comprising a nuclear magnetic resonance signal; and
an image generation unit configured to generate an image, using the measurement data acquired by the imaging unit through undersampling, the image generation unit comprising
an iterative approximation unit configured to update the measurement data by executing an iterative approximation process to perform iterative approximation with respect to the measurement data, each iteration of the iterative approximation process including transforming the measurement data into processed spatial data of the iterative approximation, further processing the spatial data, and transforming the further processed spatial data into updated measurement data,
a density estimation unit configured to estimate density of the updated measurement data, and
a density correction unit configured to execute a density correction process to perform, based on the density estimate by the density estimation unit, density correction on the updated measurement data, to generate density-corrected measurement data, the image generated by the image generation unit being based on the density-corrected measurement data obtained by the density correction process by the density correction unit,
wherein the iterative approximation unit determines whether the updated measurement data is convergent and terminates the iterative approximation process upon determining that the updated measurement data is convergent, and
in each iteration of the iterative approximation process, the density correction unit executes the density correction process while varying the density correction amount, under a condition that the density increases monotonically.

2. The magnetic resonance imaging apparatus according to claim 1, wherein the density correction unit divides the measurement data into a plurality of areas, determines the density correction amount from the density obtained as to each area, and performs the density correction.

3. The magnetic resonance imaging apparatus according to claim 1, wherein the density correction unit performs the density correction on the measurement data as a correction target; on the first data of measurement points acquired by the imaging unit, and on the second data of the measurement points estimated by the iterative approximation process, with assigning weights thereon, the weights being different between the first data and the second data.

4. The magnetic resonance imaging apparatus according to claim 1, wherein the density correction unit performs the density correction based on a predetermined density variation.

5. The magnetic resonance imaging apparatus according to claim 1, wherein the density correction unit determines an initial value of the density correction amount according to a data collection method employed in the imaging unit.

6. The magnetic resonance imaging apparatus according to claim 1, wherein the density correction unit performs the density correction after completion of the iteration of the iterative approximation process by the iterative approximation unit.

7. The magnetic resonance imaging apparatus according to claim 1, wherein the iterative approximation unit comprises a Fourier transform unit configured to perform a transform from the measurement data to real spatial data, and an inverse transform thereof, and a space transform unit configured to perform a transform from the real spatial data to spatial data for regularization and the inverse transform thereof.

8. The magnetic resonance imaging apparatus according to claim 1, wherein the iterative approximation unit performs an operation based on the Alternating Split Bregman method.

9. A magnetic resonance imaging apparatus comprising:
an imaging unit configured to acquire measurement data comprising a nuclear magnetic resonance signal; and
an image generation unit configured to generate an image, using the measurement data acquired by the imaging unit through undersampling, the image generation unit comprising
an iterative approximation unit configured to update the measurement data by executing an iterative approximation process to perform iterative approximation with respect to the measurement data, each iteration of the iterative approximation process including transforming the measurement data into processed spatial data of the iterative approximation, further processing the spatial data, and transforming the further processed spatial data into updated measurement data,
a density estimation unit configured to estimate density of the updated measurement data, and
a density correction unit configured to execute a density correction process to perform density correction, in a density correction amount based on the density estimate by the density estimation unit, on the updated measurement data, to generate density-corrected measurement data, the image generated by the image generation unit being based on the density-corrected measurement data obtained by the density correction by the density correction unit,
wherein the iterative approximation unit determines whether the updated measurement data is convergent and terminates the iterative approximation process upon determining that the updated measurement data is convergent, and
in each iteration of the iterative approximation process, the density correction unit adjusts the density correction amount and executes the density correction process, under the condition that updating insufficiency of the measurement data being updated by the iterative approximation process is between or equal to 0 to 1.

* * * * *